(12) United States Patent
Kuttner

(10) Patent No.: US 6,181,215 B1
(45) Date of Patent: Jan. 30, 2001

(54) QUARTZ OSCILLATOR CIRCUIT HAVING SYNCHRONOUSLY SWITCHED FREQUENCY ADJUSTING CAPACITORS

(75) Inventor: Franz Kuttner, St. Ulrich (AT)

(73) Assignee: Infineon Technologies AG, Munich (DE)

( * ) Notice: Under 35 U.S.C. 154(b), the term of this patent shall be extended for 0 days.

(21) Appl. No.: 09/519,542

(22) Filed: Mar. 6, 2000

Related U.S. Application Data

(63) Continuation of application No. PCT/DE98/02515, filed on Aug. 27, 1998.

(30) Foreign Application Priority Data

Sep. 4, 1997 (DE) .............................................. 197 38 718

(51) Int. Cl.$^7$ .................................................. H03B 5/36
(52) U.S. Cl. .................................. 331/116 FE; 331/158; 331/179
(58) Field of Search ......................... 331/116 FE, 116 R, 331/158, 179

(56) References Cited

U.S. PATENT DOCUMENTS

| | | | |
|---|---|---|---|
| 4,941,156 | 7/1990 | Stern et al. | 375/372 |
| 5,036,294 | * 7/1991 | McCaslin | 331/1 A |
| 5,457,433 | 10/1995 | Westwick | 331/116 FE |

FOREIGN PATENT DOCUMENTS

| | | |
|---|---|---|
| 195 46 928 | 6/1997 | (DE) . |
| 431 887 A2 | 6/1991 | (EP) . |
| 563 945 A1 | 10/1993 | (EP) . |
| 564 377 A1 | 10/1993 | (EP) . |
| 641 080 A2 | 3/1995 | (EP) . |

* cited by examiner

Primary Examiner—Siegfried H. Grimm
(74) Attorney, Agent, or Firm—Herbert L. Lerner; Laurence A. Greeberg; Werner H. Stemer

(57) ABSTRACT

The oscillator circuit has a first and a second circuit node and a parallel circuit of a quartz resonator, a first inverter, and a first resistor element connected between the circuit nodes. The first circuit node is connected to a reference potential via a first capacitor circuit, and the second circuit node is connected to the reference potential via a second capacitor circuit. The first capacitor circuit has at least two capacitors whose first electrode is connected to the reference potential, and whose second electrode is connected to the first circuit node via one switching element each. Furthermore, the oscillator circuit has a precharging circuit for precharging the capacitors, and a synchronizing circuit for switching in the capacitors at an instant in which the precharging potential corresponds to the potential at the first circuit node.

7 Claims, 2 Drawing Sheets

QUARTZ OSCILLATOR CIRCUIT HAVING SYNCHRONOUSLY SWITCHED FREQUENCY ADJUSTING CAPACITORS

CROSS-REFERENCE TO RELATED APPLICATION

This is a continuation of copending international application PCT/DE98/02515, filed Aug. 27, 1998, which designated the United States.

BACKGROUND OF THE INVENTION

FIELD OF THE INVENTION

The invention lies in the field of electronics. More specifically, the invention relates to an oscillator circuit having a quartz resonator.

U.S. Pat. No. 5,117,206 (see equivalent EP 0 431 887 A2); U.S. Pat. No. 5,446,420 (EP 0 641 080 A2); and U.S. Pat. No. 4,941,156 describe oscillator circuits which include, between a first and a second circuit node, a parallel circuit of a quartz resonator, an inverter and a resistor element. The circuit nodes are each connected to ground via at least one capacitor. At least one of the circuit nodes has a parallel circuit of a sizable number of capacitors which can be switched in or off by means of switches. The frequency of the oscillator circuit can be set in this way.

When the capacitors are switched in or off at arbitrary instants during the operation of the oscillator circuit, the oscillation generated is subjected to an unpredictable influence at the switching instant because of the sudden change in the total capacitance at the respective circuit node.

SUMMARY OF THE INVENTION

The object of the invention is to provide an oscillator circuit with an oscillator quartz which overcomes the above noted deficiencies and disadvantages of the prior art devices and methods of this kind, and which automatically sets the switching instant for switching in or switching off the capacitors so that the behavior of the oscillator circuit can be calculated in advance very well.

With the above and other objects in view there is provided, in accordance with the invention, an oscillator circuit, comprising:

a first circuit node and a second circuit node;

a parallel circuit including a quartz resonator, a first inverter, and a first resistor element connected in parallel between the first and second circuit nodes;

a first capacitor circuit connected between the first circuit node and a reference potential;

a second capacitor circuit connected between the second circuit node and the reference potential;

the first capacitor circuit having at least two capacitors each with a first terminal connected to the reference potential and a second terminal;

switching elements respectively connected between each of the second terminals of the at least two capacitors and the first circuit node; and a synchronizing circuit connected to the switching elements, the synchronizing circuit generating a synchronizing signal for switching at least one of the switching elements in dependence on a potential at the first circuit node.

In other words, the oscillator circuit has, between the first and the second circuit node, a parallel circuit of a quartz resonator, a first inverter, and a first resistor element. The first circuit node is connected to a reference potential via a first capacitor circuit, and the second circuit node is connected to a reference potential via a second capacitor circuit. The first capacitor circuit has at least two capacitors with a first and a second terminal each, whose first terminal is connected to the reference potential and whose second terminal is connected to the first circuit node via one switching element each. Moreover, it is provided that the oscillator circuit has a synchronizing circuit for generating a synchronizing signal, which triggers switching of at least one of the switching elements of the first capacitor circuit as a function of a potential at the first circuit node.

In the novel circuit, the frequency is set by actuating the switching elements, as a result of which a different number of the capacitors of the first capacitor circuit are connected in parallel with one another between the first circuit node and the reference potential. The synchronization has the advantage that during the operation of the oscillator circuit it is possible to carry out a change in the operating frequency by switching the switching elements at an instant which is determined by the oscillatory characteristics of the oscillator circuit itself. Thus, the behavior of the oscillator circuit before and after switching of at least one of the switching elements during operation can be calculated in advance very well.

In accordance with an added feature of the invention, the oscillator circuit further comprises:

a third circuit node;

each of the switching elements having a first switching state wherein the switching element connects the second terminal of a respective the capacitor to the first circuit node, and a second switching state wherein the switching element connects the second terminal to the third circuit node; and a precharging circuit connected to the third circuit node for generating a precharging potential.

In this development of the invention, therefore, the oscillator circuit has a precharging circuit in addition to the synchronizing circuit. The precharging circuit generates a precharging potential. The precharging circuit has the advantage that the capacitors of the first capacitor circuit, whose switching elements are in the second switching state, are precharged to a defined precharging potential, with the result that in the case of switching in the capacitors during operation of the oscillator circuit, that is to say in the case of a change in frequency, the potential at the first circuit node is influenced in a predictable way essentially by the fixed precharging potential.

In accordance with an additional feature of the invention, the synchronizing circuit triggers a switching of at least one of the switching elements from the second switching state into the first switching state whenever a potential at the first circuit node essentially corresponds to the precharging potential at the third circuit node.

This embodiment is particularly advantageous where the synchronizing circuit triggers switching of the switching elements precisely when the potential at the first circuit node corresponds essentially to the precharging potential at the third circuit node to which the capacitors of the first capacitor circuit which are connected thereto are precharged. Upon switching in further capacitors at the first circuit node, there is then no sort of influence on the potential at the first circuit node. As a result, the oscillatory characteristics of the oscillator circuit are virtually interference-free even in the case of changes in frequency carried out during operation.

In order to carry out the comparison between the potential at the first circuit node and the precharging potential, the synchronizing circuit can, for example, have an appropriate comparator. A simpler and very advantageous form of implementation of the synchronizing circuit is explained further below with the aid of the exemplary embodiment.

In accordance with another feature of the invention, the first inverter has a transistor of a first conductivity type and a transistor of a second conductivity type;

the precharging circuit has a second inverter with a transistor of the first conductivity type and with a transistor of the second conductivity type, and a second resistor element connected in parallel with the second inverter, one of an input and an output of the second inverter being connected to the third circuit node;

a quotient of a width-to-length ratio of the transistor of the first conductivity type to a width-to-length ratio of the transistor of the second conductivity type is substantially equal in the first inverter and in the second inverter.

In accordance with a further feature of the invention, the first inverter and the second inverter are CMOS inverters.

In accordance with again another feature of the invention, the first inverter has a transistor of a first conductivity type and a transistor of a second conductivity type;

the synchronizing circuit has a third inverter with a transistor of the first conductivity type, a transistor of the second conductivity type, an input connected to the first circuit node, and an output for outputting a synchronizing signal; and a quotient of a width-to-length ratio of the transistor of the first conductivity type to a width-to-length ratio of the transistor of the second conductivity type is substantially equal in the first inverter and in the second inverter.

In accordance with a concomitant feature of the invention, the first inverter and the third inverter are CMOS inverters.

Other features which are considered as characteristic for the invention are set forth in the appended claims.

Although the invention is illustrated and described herein as embodied in an oscillator circuit with a quartz resonator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
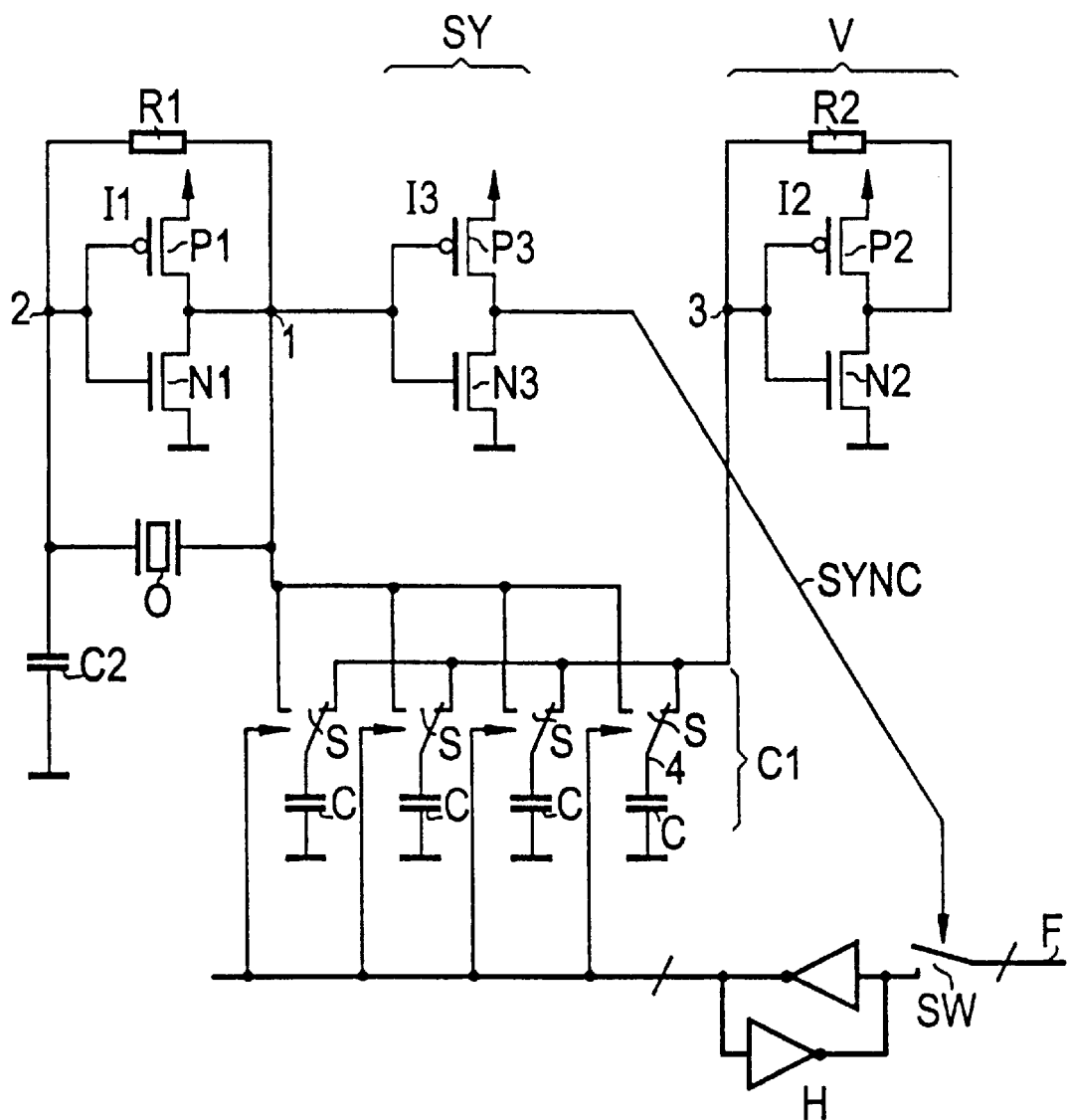
FIG. 1 is a circuit schematic of an exemplary embodiment of the invention.

Referring now to the figures of the drawing in detail and first, particularly, to FIG. 1 thereof, there is seen an oscillator circuit with a first circuit node 1 which is connected to a second circuit node 2 via a quartz resonator O. A first CMOS inverter I1 and a first resistor element R1 are connected in parallel with the quartz resonator O. The first circuit node 1 is connected to ground via a first capacitor circuit C1, and the second circuit node 2 is connected to ground via a second capacitor circuit C2 in the form of a single capacitor.

The first capacitor circuit C1 has a multiplicity of capacitors C, of which only four are represented. A first electrode of the capacitors C is connected to ground, while a second electrode is connected to one switching element S each. The switching elements S have two switching states: a first switching state, in which they connect the second electrode of the respective capacitor C to the first circuit node 1, and a second switching state, in which they connect the second terminal to a third circuit node 3. The capacitors C illustrated in FIG. 1 are all in the second switching state.

The switching state of the switching elements S in FIG. 1 is determined by corresponding digital control signals on a control bus F. The oscillator circuit oscillates when the voltage supply of the first inverter I1 is switched in and at least one of the capacitors C is connected via its switching element S to the first circuit node 1. Given an adequate number of capacitors C, it is then possible via the control bus F to vary the frequency of the oscillator circuit over a large range in a finely stepped fashion as desired.

Whereas, taken per se, the components so far described already permit operation of the oscillator circuit, in accordance with FIG. 1 the latter also has further components, specifically a precharging circuit V and a synchronizing circuit SY. The precharging circuit V has a second CMOS inverter I2, whose input is connected to the third circuit node 3, and whose input is connected to its output via a second resistor element R2. The synchronizing circuit SY has a third CMOS inverter I3, whose input is connected to the first circuit node 1 and whose output, at which a synchronizing signal SYNC is generated, is connected to a control terminal of a switch SW. At instants determined by the synchronizing signal SYNC, the switch SW switches through the signals on the control bus F, and these are stored in a holding circuit H, so that the state last present on the control bus F is stored even in the case of an open switch SW.

The transistors of the first inverter I1, the second inverter I2, and the third inverter I3 are dimensioned in each case such that for all of them the quotient of the width-to-length ratio of the p-channel transistor and the width-to-length ratio of the n-channel transistor essentially correspond. That is to say, the following relationships hold:

$$\frac{\left(\frac{W_{P1}}{L_{P1}}\right)}{\left(\frac{W_{N1}}{L_{N1}}\right)} = \frac{\left(\frac{W_{P2}}{L_{P2}}\right)}{\left(\frac{W_{N2}}{L_{N2}}\right)} = \frac{\left(\frac{W_{P3}}{L_{P3}}\right)}{\left(\frac{W_{N3}}{L_{N3}}\right)}$$

Since, in the case of CMOS inverters the described quotient fundamentally determines the DC voltage operating point, this is the same for all three inverters I1, I2, I3. Since, during operation of the oscillator circuit, the second inverter I2 of the precharging circuit V is virtually always operated at the DC voltage operating point, because it does not oscillate, the precharging potential at the third circuit node 3 is identical to this DC voltage operating point. Because of the identical operating points, which correspond to the switching points of the inverters I1, I2, I3, the third inverter I3 of the synchronizing circuit SY switches as soon as the first inverter I1, and thus the potential at the first circuit node 1 passes through the DC voltage operating point.

Figure 2:
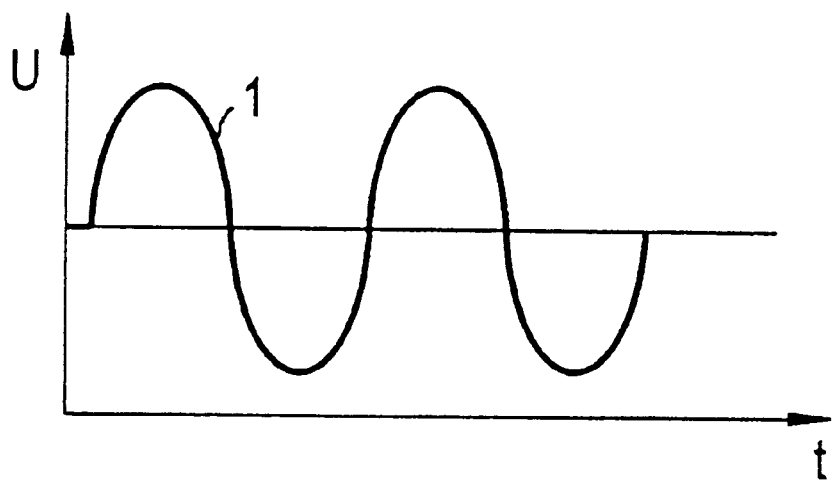
FIGS. 2 and 3 are graphical signal profiles relating to the circuit of FIG. 1.
Figure 3:
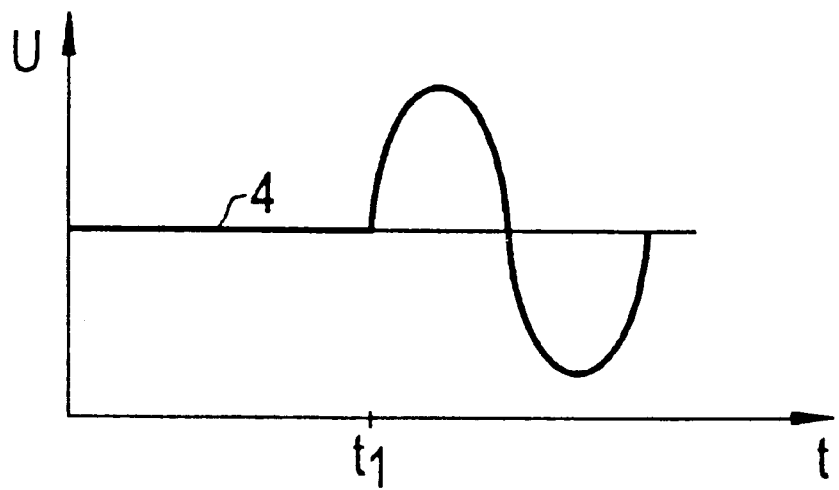

FIG. 2 shows the potential at the first circuit node 1, while FIG. 3 shows the potential at a fourth circuit node 4 which is connected to the second electrode of the capacitor C at the far right in FIG. 1. The horizontal line in FIG. 2 and FIG. 3 respectively denotes the DC operating point of the instant t1 the capacitor C is connected via its switching element S to the third circuit node 3, and is therefore precharged to the precharging potential, which is equal to the DC operating point. At the instant t1, the third inverter I3 detects the "zero crossing" of the potential at the first circuit node 1, and likewise immediately switches over. The switch SW is switched over via the synchronizing signal SYNC (that is to say, closed or open), so that digital signals present on the control bus F are switched through to exemplary embodiment considered here, the digital signals switch the switching element S of the respective capacitor C on the far right in FIG. 1, so that its second electrode is now connected to the first circuit node 1, with the result that its potential corresponds to that of the fourth circuit node 4. This is to be seen in FIG. 3 from the instant t1. The change in frequency of the oscillation at the circuit node 1 effected by switching in the capacitor C at the instant t1 has not been represented in FIGS. 2 and 3.

In order to achieve virtually identical DC voltage operating points of the three inverters I1, I2, I3, and thus virtually identical quotients of the width-to-length ratios of their transistors, their p-channel or n-channel transistors respectively have the same design or layout (geometric dimensions in the integrated circuit). Since the first inverter I1 must supply a larger current than the second inverter I2 and the third inverter I3, its transistors should, however, be dimensioned to be larger than these. This can be achieved by virtue of the fact that, instead of a single p-channel transistor P1 and a single n-channel transistor N1 in each case a plurality of similar p-channel and n-channel transistors which are dimensioned identically and have the same design or layout as those of the second I2 and of the third I3 inverter are connected in parallel with one another to produce the first inverter I1.

The digital data on the control bus F are binary codes. The capacitance network of the capacitors C of the first capacitor circuit C1 can likewise be designed with binary weighting and controlled directly with the aid of the binary code. However, it is better for at least the MSBs (most significant bits) of the digital control signals to be recoded in advance into a thermometer code, since in the case of the binary code, for example upon transition from "01111" to "10000", half the capacitance network must be switched in and the other half switched out. In the case of a 10-bit control word on the control bus F, the uppermost 5 bits are favorably recoded into the thermometer code. The capacitance network of 31 capacitors C of the same size is constructed accordingly for the five MSBs and five binary weighted capacitors C for the LSBs (least significant bits). In the case of the use of the oscillator circuit in the closed loop of a PLL (Phase Locked Loop), one of the main fields of use of the oscillator circuits, the digital control word in the feedback loop varies continuously and not suddenly, so that a maximum of $\frac{1}{31}$ of the capacitance is switched over at each instant.

The oscillator circuit represented in FIG. 1 permits the capacitors C of the first capacitor circuit C1 to be switched in and switched out synchronously with the oscillatory characteristics of the oscillator. There are advantageously no jumps in phase and frequency when the frequency is changed during operation of the oscillator circuit.

I claim:

1. An oscillator circuit, comprising:
    a first circuit node;
    a second circuit node;
    a parallel circuit including a quartz resonator, a first inverter, and a first resistor element connected in parallel between said first and second circuit nodes;
    a first capacitor circuit connected between said first circuit node and a reference potential;
    a second capacitor circuit connected between said second circuit node and the reference potential;
    said first capacitor circuit having at least two capacitors each with a first terminal connected to the reference potential and a second terminal;
    switching elements respectively connected between each of said second terminals of said at least two capacitors and said first circuit node; and
    a synchronizing circuit connected to said switching elements, said synchronizing circuit generating a synchronizing signal for switching at least one of said switching elements in dependence on a potential at said first circuit node.

2. The oscillator circuit according to claim 1, which further comprises:
    a third circuit node;
    each of said switching elements having a first switching state wherein said switching element connects said second terminal of a respective said capacitor to said first circuit node, and a second switching state wherein said switching element connects said second terminal to said third circuit node; and
    a precharging circuit connected to said third circuit node for generating a precharging potential.

3. The oscillator circuit according to claim 2, wherein said synchronizing circuit triggers a switching of at least one of said switching elements from the second switching state into the first switching state whenever a potential at said first circuit node essentially corresponds to the precharging potential at said third circuit node.

4. The oscillator circuit according to claim 2, wherein said first inverter has a transistor of a first conductivity type and a transistor of a second conductivity type;
    said precharging circuit has a second inverter with a transistor of the first conductivity type and with a transistor of the second conductivity type, and a second resistor element connected in parallel with said second inverter, one of an input and an output of said second inverter being connected to said third circuit node;
    a quotient of a width-to-length ratio of said transistor of the first conductivity type to a width-to-length ratio of said transistor of the second conductivity type is substantially equal in said first inverter and in said second inverter.

5. The oscillator circuit according to claim 4, wherein said first inverter and said second inverter are CMOS inverters.

6. The oscillator circuit according to claim 1, wherein:
    said first inverter has a transistor of a first conductivity type and a transistor of a second conductivity type;
    said synchronizing circuit has a third inverter with a transistor of the first conductivity type, a transistor of the second conductivity type, an input connected to said first circuit node, and an output for outputting a synchronizing signal; and
    a quotient of a width-to-length ratio of said transistor of the first conductivity type to a width-to-length ratio of said transistor of the second conductivity type is substantially equal in said first inverter and in said third inverter.

7. The oscillator circuit according to claim 6, wherein said first inverter and said third inverter are CMOS inverters.

* * * * *